United States Patent
Lau et al.

(10) Patent No.: US 8,671,319 B2
(45) Date of Patent: Mar. 11, 2014

(54) DYNAMIC DEVICE IDENTIFICATION FOR MAKING A JTAG DEBUG CONNECTION WITH A INTERNET BROWSER

(75) Inventors: Stephen Yee Shun Lau, Houston, TX (US); Vikas Varshney, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/526,733

(22) Filed: Jun. 19, 2012

(65) Prior Publication Data

US 2013/0339812 A1  Dec. 19, 2013

(51) Int. Cl.
 *G01R 31/28* (2006.01)
(52) U.S. Cl.
 USPC ............. 714/727; 714/726; 714/729; 714/37; 717/120; 717/177; 717/178; 717/135; 717/138; 717/124; 717/134; 715/229

(58) Field of Classification Search
 None
 See application file for complete search history.

(56) References Cited

U.S. PATENT DOCUMENTS

| | | | | |
|---|---|---|---|---|
| 6,922,820 | B1 * | 7/2005 | Lulla et al. | 716/101 |
| 7,095,718 | B1 * | 8/2006 | Terry | 370/241 |
| 2003/0217306 | A1 * | 11/2003 | Harthcock et al. | 714/30 |
| 2003/0225566 | A1 * | 12/2003 | O'Brein et al. | 703/24 |
| 2008/0028349 | A1 * | 1/2008 | Muranaka | 716/5 |
| 2010/0107146 | A1 * | 4/2010 | Wrighton et al. | 717/134 |
| 2011/0194425 | A1 * | 8/2011 | Li et al. | 370/252 |
| 2012/0331348 | A1 * | 12/2012 | La Fever et al. | 714/37 |

* cited by examiner

*Primary Examiner* — John Trimmings
(74) *Attorney, Agent, or Firm* — Robert D. Marshall, Jr.; W. James Brady; Frederick J. Telecky, Jr.

(57) ABSTRACT

An operating system independent JTAG debugging system implemented to run in a web browser. The software executing in the browser identifies the JTAG enabled components in the target system that is to be tested, and automatically downloads the latest versions of the appropriate software, JTAG drivers and configuration information from a test server.

2 Claims, 2 Drawing Sheets

DYNAMIC DEVICE IDENTIFICATION FOR MAKING A JTAG DEBUG CONNECTION WITH A INTERNET BROWSER

TECHNICAL FIELD OF THE INVENTION

The technical field of this invention is JTAG Boundary Scan Testing.

BACKGROUND OF THE INVENTION

Since its introduction as an industry standard in 1990, boundary scan (also known as JTAG, developed by the Joint Test Action Group) has enjoyed growing popularity for board level manufacturing test applications. JTAG has rapidly become the technology of choice for building reliable high technology electronic products with a high degree of testability. Due to the low-cost and IC level access capabilities of JTAG, its use has expanded beyond traditional board test applications into product design and service.

JTAG, as defined by the IEEE Std.-1149.1 standard, is an integrated method for testing interconnects on printed circuit boards (PCBs) that are implemented at the integrated circuit (IC) level. The inability to test highly complex and dense printed circuit boards using traditional in-circuit testers and bed of nail fixtures was already evident in the mid eighties. Due to physical space constraints and loss of physical access to fine pitch components and BGA devices, fixturing cost increased dramatically while fixture reliability decreased at the same time.

The JTAG test architecture provides a means to test interconnects between integrated circuits on a board without using physical test probes. It adds a boundary-scan cell that includes a multiplexer and latches to each pin on the device. Boundary-scan cells in a device can capture data from pin or core logic signals, or force data onto pins. Captured data is serially shifted out and externally compared to the expected results. Forced test data is serially shifted into the boundary-scan cells. All of this is controlled from a serial data path called the scan path or scan chain. By allowing direct access to nets, JTAG eliminates the need for a large number of test vectors, which are normally needed to properly initialize sequential logic. Tens or hundreds of vectors may do the job that had previously required thousands of vectors. Potential benefits realized from the use of JTAG are shorter test times, higher test coverage, increased diagnostic capability and lower capital equipment cost.

If a circuit contains more than one device that supports JTAG, they can be linked together to form a 'JTAG Chain'. In a JTAG chain the data output from the first device becomes the data input to the second device; the control and clock signals are common to all devices in the chain. FIG. 1 provides a representation of a simple JTAG chain containing three devices.

In FIG. 1 (Prior Art) devices 101, 102 and 103 have boundary scan implemented, and are connected as shown. JTAG employs four test connections:

TCK (105)—the TCK or 'test clock' synchronizes the internal state machine operations.

TMS (104)—the TMS or 'test mode state' is sampled at the rising edge of TCK to determine the next state.

TDI (106)—the TDI or 'test data in' represents the data shifted into the device's test or programming logic. It is sampled at the rising edge of TCK when the internal state machine is in the correct state.

TDO (107)—the TDO or 'test data out' represents the data shifted out of the device's test or programming logic and is valid on the falling edge of TCK when the internal state machine is in the correct state.

The current trend for reduced product size, such as portable phones and digital cameras, higher functional integration, faster clock rates, and shorter product life-cycles with dramatically faster time to market has created new technology trends. These trends include increased device complexity, fine pitch components, such as Surface-Mount Technology (SMT), Multi Chip Modules (MCM), Ball Grid Arrays (BGA), increased IC pin counts and smaller PCB traces. These technology advances, in turn create problems in PCB development:

Many boards include components that are assembled on both sides of the board. Most of the through-holes and traces are buried and inaccessible.

Loss of physical access to fine pitch components, such as SMTs and BGAs makes it difficult to probe the pins and distinguish between manufacturing and design problems.

Small-size products do not have test points, making it difficult or impossible to probe suspected nodes.

Many Complex Programmable Logic Devices and flash memory devices are not socketed and are soldered directly to the board.

JTAG technology is the only cost effective solution that can deal with the above problems. In recent years, the number of devices that include JTAG has grown dramatically. Almost every new microprocessor that is being introduced includes JTAG circuitry for testing and in-circuit emulation As the acceptance of JTAG as the main technology for interconnect testing and in-system programming has increased, the various JTAG test tools have matured as well. The increased number of JTAG components and mature JTAG tools, as well as other factors result in the following benefits:

Easy to implement Design For Testability (DFT) rules.
Design analysis prior to PCB layout to improve testability.
Packaging problems are found prior to PCB layout.
Little need for test points.
No need for test fixtures.
More control over the test process.
Quick diagnosis (with high resolution) of interconnection problems without writing any functional test code.
JTAG emulation and source-level debugging.

SUMMARY OF THE INVENTION

A JTAG test and debugging system is implemented using a web browser which interacts with a JTAG device test controller to obtain the JTAG ID of the device to be tested. The JTAG ID is unique for every device, and is then sent to a server which has a list of JTAG IDs and device marketing names, JTAG device topology, debug peripheral addresses, device peripheral information, and the necessary debug software for the selected device. This eliminates the possibility of the user selecting the wrong device being selected, and assures the use of the latest debug software and device configuration for the device being tested.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
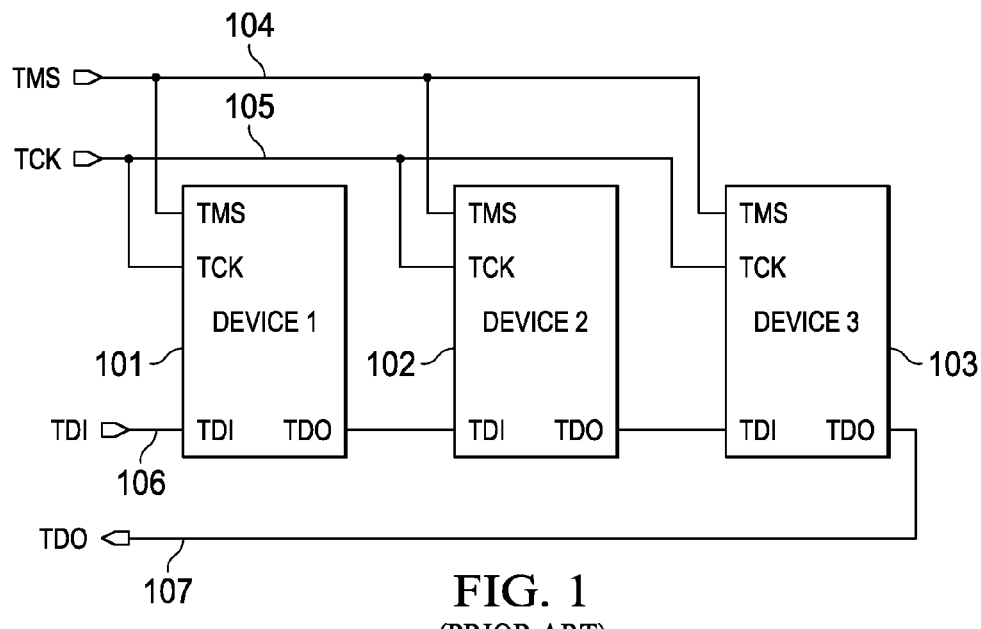
FIG. 1 shows a simple board level JTAG test implementation.
Figure 2:
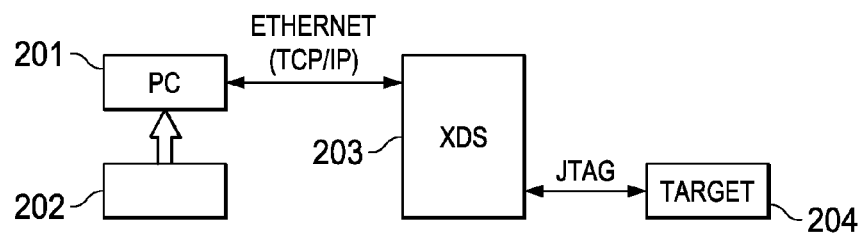
FIG. 2 shows a typical JTAG test setup.

A JTAG debugging and testing setup, as known in the prior art is shown in FIG. 2. The system consists of an data processor 201 that may be a Personal Computer, an emulator or Device Test Controller 203, a target system 204, and means 202 for updating the debugging or testing software installed on the data processor 201.

The software installed in data processor 201 consists of the debugger and the JTAG drivers needed to access the target 204. This software and the drivers are specific to the various devices incorporated in the target, and need to be loaded into the data processor. In one implementation the software consists of the Texas Instruments Code Composer Studio (CCS) providing an Integrated Debugging Environment (IDE) enabling the debug of Texas Instruments processors and other devices installed in the target. Again, updates to the CCS must be uploaded to the data processor. In current implementations this is a manual procedure, where the updates are physically shipped to the user to be installed prior to execution. A portion of the debugging software and drivers are downloaded to the emulator 203 from the data processor at execution time.

Figure 3:
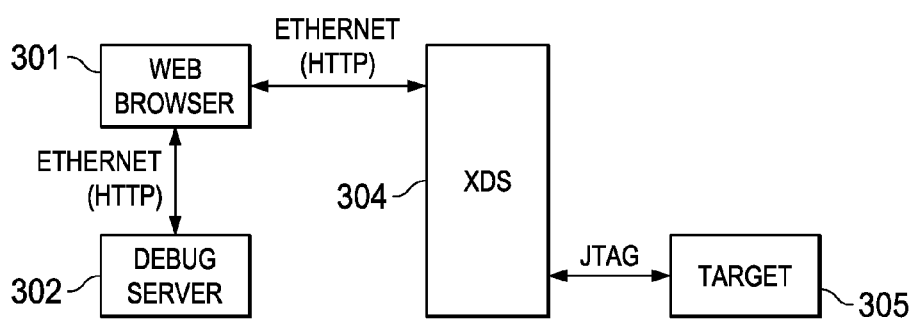
FIG. 3 illustrates the Web Browser based JTAG test arrangement described in this invention.

A novel, more efficient approach is shown in FIG. 3, where the debugging software and the JTAG drivers are executed in Web Browser 301.

By running the debugging software and JTAG drivers in the browser, the debugger and JTAG driver software would be instantiated with each use by the user. As it is instanced from the server, the latest versions of the debugger software and JTAG drivers would be available to the user. This would mean that any new core support, bug fixes, etc. would be available as soon as they are available on the server. Because the debugging software and JTAG drivers are running in the browser, there would be no operating system interactions or compatibility problems with installed SW. Because the debugger and JTAG driver are dynamically downloaded only when needed, the download size would be small.

This solution does not require the user to proactively search for updates to the software, or rely on the software to periodically check for software updates.

Every execution of the debugger software would be running the latest version, and this solution would not be dependent on a particular operating system.

As shown in FIG. 3, web browser 301 is connected through an Ethernet (Http) connection to Debug Server 302. All required software and JTAG drivers are loaded to the web browser for execution as required from the server. The web browser is also connected through an Ethernet (Http) connection to the emulator 304, and the JTAG drivers may, in one implementation reside completely within the emulator which provides the physical connection to the target 305.

In an alternate implementation the debugger software and the debugging drivers may be executing directly inside the web browser. The benefit for this implementation is that since the debugging drivers are in the browser, the emulator design can be simplified. The emulator would provide a connection to the target hardware, but would have little to no understanding of the target it was talking to. Because the debugging software and the debugging drivers are running in the browser, there is no requirement to install or update software by the end user.

Figure 4:
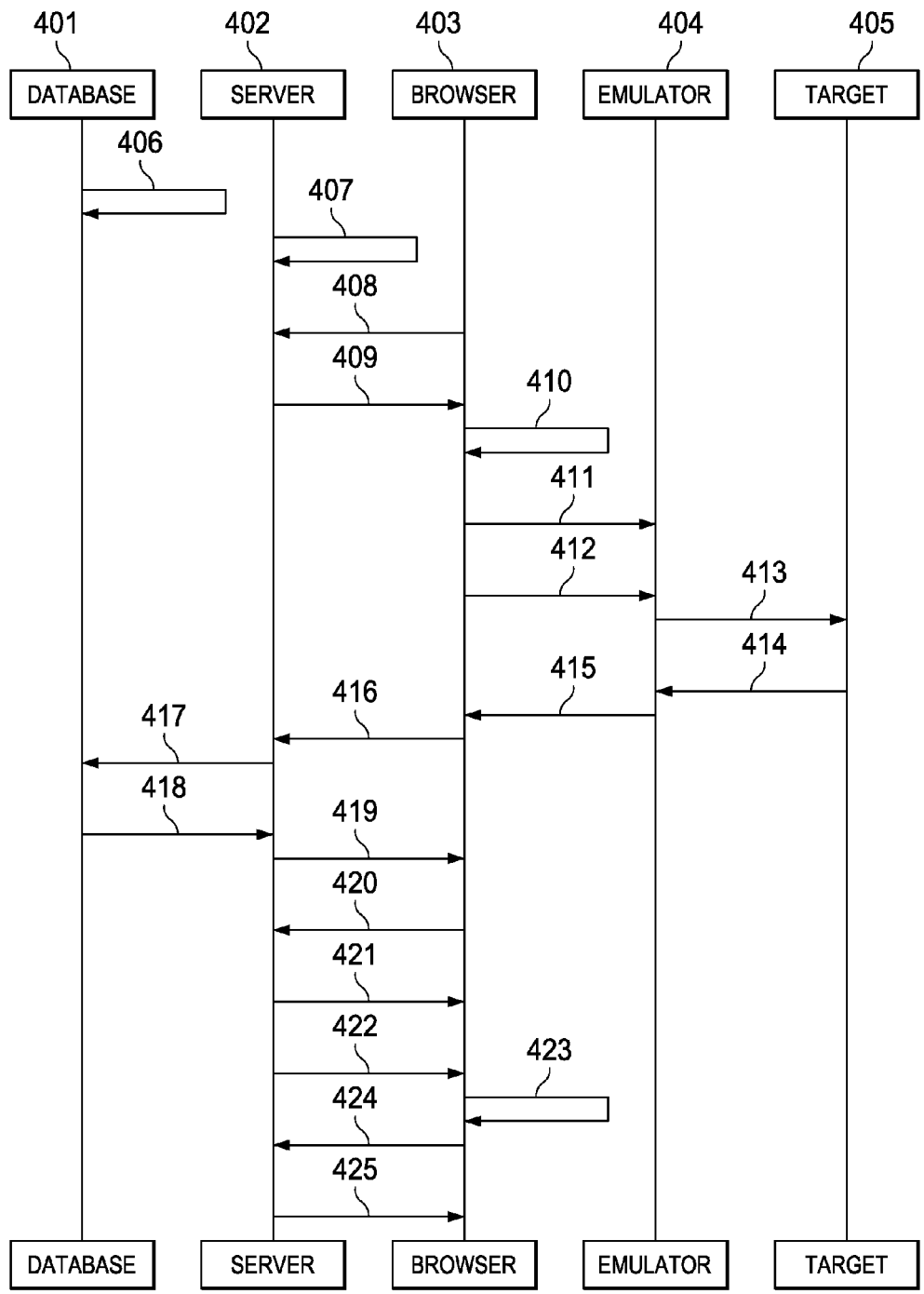
FIG. 4 shows a sequence diagram.

The steps involved in implementing a web browser based system is shown in FIG. 4. The communication sequence is shown between Database 401, Server 402, Browser 403, Emulator 404 and Target 405.

406 Populate database 401 with JTAG IDs and associated device names.
407 Load debugger server from database.
408 Connect browser 403 to server 402 debugger service.
409 Server 402 sends list of supported emulators to browser 403.
410 Browser 403 selects emulator 404 that will be used and configures applicable software.
411 Browser 403 connects to and activates emulator 404.
412 Browser 403 requests JTAG IDs from emulator 404
413 Emulator 404 scans target 405 for JTAG IDs.
414 Target 405 sends JTAG IDs to emulator 404.
415 Emulator 404 sends JTAG IDs to browser 404.
416 Browser 403 sends JTAG IDs to server 402.
417 Server 402 requests list of devices matching the supplied JTAG IDs from database 401.
418 Database 401 provides requested list of devices to server 402.
419 Server 402 sends list of devices matching the JTAG IDs to browser 403.
420 Browser 403 selects appropriate emulator and sends information to server 402.
421 Server 402 sends configuration information to browser 403 as a cookie.
422 Server 402 sends debug software for devices matching the JTAG IDs to browser 403.

At this point the latest version of the software and drivers are available for execution in the browser. At the start of a subsequent debug session the system checks for software updates as follows:

423 Browser 403 reads the last configuration cookie.
424 Browser 403 provides the configuration information recovered from the cookie to server 402.
425 Server 402 provides any applicable software updates to browse 403.

What is claimed is:

1. A component testing and debugging system comprising of:
   a server containing a database populated with a list of JTAG IDs relevant to devices to be tested, testing and debug software, device marketing names, JTAG device topology, debug peripheral addresses and device peripheral information that are all uniquely associated with said JTAG IDs;
   a browser connected to said server and operable to receive selected executable software and configuration information from said database via said server,
   a device test controller connected to said browser and operable for connection to a target system to be tested, said device test controller operable to configure according to said executable software and configuration received from said browser to control test of the target system to be tested; and
   wherein upon each initiation of said component testing and debugging system
     said device test controller is further operable to determine a JTAG ID of JTAG enabled components on the target system to be tested, and supply said JTAG ID to said browser,
     said browser is further operable to receive the JTAG ID from the device test controller, and supply the received JTAG ID to said server and
     said server is further operable to receive the JTAG ID from the browser and select executable software and configuration information from said database for supply to said browser based on the JTAG ID.

2. A method of component testing and debugging comprising the steps of:

populating a server database with a list of JTAG IDs relevant to devices to be tested, testing and debug software, device marketing names, JTAG device topology, debug peripheral addresses and device peripheral information that are all uniquely associated with said JTAG IDs;

determining the JTAG IDs of JTAG enabled components in a target system at the start of a test and debug session;

providing said testing and debug software and configuration information appropriate to said JTAG IDs to a device test controller; and testing and debugging the target system by the device test controller based upon the provided testing and debug software and configuration information.

* * * * *